United States Patent
Brama

(10) Patent No.: US 11,536,751 B2
(45) Date of Patent: Dec. 27, 2022

(54) METHOD TO PROVIDE ANALOG VOLTAGE SIGNAL PROPORTIONAL TO 4-20MA TRANSMITTER CURRENT USING A DCDC CONVERTER ACROSS GALVANIC ISOLATION OF A TRANSFORMER

(71) Applicant: FISHER CONTROLS INTERNATIONAL LLC, Marshalltown, IA (US)

(72) Inventor: Marwan Brama, Singapore (SG)

(73) Assignee: FISHER CONTROLS INTERNATIONAL LLC, Marshalltown, IA (US)

(*) Notice: Subject to any disclaimer, the term of this patent is extended or adjusted under 35 U.S.C. 154(b) by 46 days.

(21) Appl. No.: 17/089,191

(22) Filed: Nov. 4, 2020

(65) Prior Publication Data
US 2022/0137101 A1    May 5, 2022

(51) Int. Cl.
*G01R 19/00* (2006.01)
*H01F 27/28* (2006.01)

(52) U.S. Cl.
CPC .......... *G01R 19/0046* (2013.01); *H01F 27/28* (2013.01)

(58) Field of Classification Search
CPC .......................... G01R 19/0046; H01F 27/28
See application file for complete search history.

(56) References Cited

U.S. PATENT DOCUMENTS

| 7,626,378 B1* | 12/2009 | Fest | G01R 15/18 |
| | | | 324/126 |
| 2014/0268911 A1* | 9/2014 | Telefus | H02M 3/33523 |
| | | | 363/21.08 |
| 2020/0028386 A1* | 1/2020 | Sexton | H02J 50/10 |

* cited by examiner

*Primary Examiner* — Akm Zakaria
(74) *Attorney, Agent, or Firm* — Marshall, Gerstein & Borun LLP

(57) ABSTRACT

The present disclosure provides a circuit comprising: a 4-20 mA transmitter; a transformer having a primary winding and a secondary winding; a first current-sense resistor connected in series with the primary winding and a current regulator, wherein the current-sense resistor is configured to measure a first voltage and provide the measured first voltage to the current regulator, the current regulator being configured to output a current proportional to the measured first voltage; and a second current-sense resistor connected in series with the secondary winding, wherein the current-sense resistor is configured to measure a second voltage such that a current associated with the 4-20 mA transmitter is determined based on the second voltage.

20 Claims, 3 Drawing Sheets

METHOD TO PROVIDE ANALOG VOLTAGE SIGNAL PROPORTIONAL TO 4-20MA TRANSMITTER CURRENT USING A DCDC CONVERTER ACROSS GALVANIC ISOLATION OF A TRANSFORMER

FIELD OF THE DISCLOSURE

The present disclosure generally relates to providing analog voltage signal across galvanic isolation of a transformer, proportional to the transmitter current of 4-20 mA devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Process control systems, like those used in chemical and petroleum processes, typically include one or more process controllers communicatively coupled to at least one host or operator workstation and to one or more field devices via analog, digital, or combined analog/digital communication links.

A process controller (sometimes referred to as a "controller"), which is typically located within the plant environment, receives signals (sometimes referred to as "control inputs") indicative of process measurements and uses the information carried by these signals to implement control routines that cause the controller to generate control signals (sometimes referred to as "control outputs") based on the control inputs and the internal logic of the control routines. The controllers send the generated control signals over buses or other communication links to control operation of field devices. In some instances, the controllers may coordinate with control routines implemented by smart field devices, such as Highway Addressable Remote Transmitter (HART®), Wireless HART®, and FOUNDATION® Fieldbus (sometimes just called "Fieldbus") field devices.

The field devices, which may be, for example, valves, valve positioners, switches, and transmitters (e.g., including temperature, pressure, level, or flow rate sensors), are located within the plant environment and generally perform physical or process control functions. For example, a valve may open or close in response to a control output received from a controller, or may transmit to a controller a measurement of a process parameter so that the controller can utilize the measurement as a control input. Smart field devices, such as field devices conforming to the Fieldbus protocol, may also perform control calculations, alarming functions, and other control functions commonly implemented within a process controller. Field devices may be configured to communicate with controllers and/or other field devices according to various communication protocols. For example, a plant may include traditional analog 4-20 mA field devices, HART® field devices, or Fieldbus field devices.

Traditional analog 4-20 mA field devices communicate with a controller via a two-wire communication link (sometimes called a "loop" or "current loop") configured to carry an analog 4-20 mA DC signal indicative of a measurement or control command. For example, a level transmitter may sense a tank level and transmit via the loop a current signal corresponding to that measurement (e.g., a 4 mA signal for 0% full, a 12 mA signal for 50% full, and a 20 mA signal for 100% full). The controller receives the current signal, determines the tank level measurement based on the current signal, and takes some action based on the tank level measurement (e.g., opening or closing an inlet valve).

SUMMARY

The present application provides systems and methods for providing analog signal across a galvanic isolation, proportional to 4-20 mA transmitter current. That is, conventionally, in a digital valve controller (such as the Fisher™ FIELDVUE™ DVC6200 Digital Valve Controller) a 4-20 mA transmitter is designed to use a DC/DC converter integrated circuit to transfer power across a transformer's galvanic isolation by drawing fixed current in series with the transformer's primary winding. The present disclosure provides an improved circuit by using a variable current rather than a fixed current as is conventionally used. When the current changes, the amount of power transferred to the secondary winding will also change, which can be used to provide a signal via the secondary winding that is proportional to the current in series with the primary winding. Accordingly, the same transformer that is used to transfer power from the 4-20 mA transmitter may also be used to transfer a signal from the 4-20 mA transmitter, advantageously reducing the component counts and cost. This signal can then be used as a diagnostic for further processing.

Generally speaking, the actual current of 4-20 mA transmitter may be read by measuring the voltage across current-sense resistor, and this voltage may be used as an input signal to a current regulator connected in series with a primary winding of a transformer. The output of the current regulator is a current proportional to its voltage input, which is proportional to the actual 4-20 mA transmitter current. The voltage across the primary winding does not change significantly, and the voltage of the secondary winding may be fixed using a shunt regulator. Thus, the resulting current of the secondary winding of the transformer is proportional to the current of the primary winding of the transformer. The current of the secondary winding of the transformer can then be measured by measuring the voltage across a current sense resistor connected in series with the secondary winding of the transformer. Accordingly, the voltage across the current sense resistor will be proportional to the actual 4-20 mA transmitter current, allowing signals to be transferred across the transformer's galvanic isolation by varying the 4-20 mA transmitter current. The voltage can be filtered to reduce noise or amplified to meet the input voltage range of the measurement device as needed (e.g., a voltmeter, analog-to-digital converter of a microcontroller, etc.).

In one aspect, a circuit is provided, comprising: a 4-20 mA transmitter; a transformer having a primary winding and a secondary winding; a first current-sense resistor connected in series with the primary winding and a current regulator, wherein the current-sense resistor is configured to measure a first voltage and provide the measured first voltage to the current regulator, the current regulator being configured to output a current proportional to the measured first voltage; and a second current-sense resistor connected in series with the secondary winding, wherein the current-sense resistor is configured to measure a second voltage such that a current associated with the 4-20 mA transmitter is determined based on the second voltage.

In another aspect, a method is provided, comprising: measuring a first voltage across a first current-sense resistor connected in series with a 4-20 mA transmitter; providing the measured first voltage as an input signal to a current regulator connected in series with a primary winding of a transformer, the current regulator being configured to output a current proportional to the measured first voltage provided as the input signal; measuring a second voltage across a second current-sense resistor connected in series with a secondary winding of the transformer; and determining, based on the measured second voltage across the second current-sense resistor, a current associated with the 4-20 mA transmitter.

In further accordance with any one or more of the foregoing first or second aspects, a circuit and/or method may further include any one or more of the following preferred forms.

In some preferred forms, a power transferred from the primary winding to the secondary winding across the transformer is provided as a power output in series with the secondary winding.

Moreover, in some preferred forms, the power output is provided to a controller or other field device in series with the secondary winding.

Furthermore, in some preferred forms, determining the current associated with the 4-20 mA transmitter is based on a proportionality, of the measured first voltage to the output current, associated with the current regulator.

Additionally, in some preferred forms, determining the current associated with the 4-20 mA transmitter is based on a current proportionality across the primary winding and secondary winding of the transformer.

Moreover, in some preferred forms, the measured second voltage across the second current-sense resistor is provided as an output signal.

Furthermore, in some preferred forms, determining the current associated with the 4-20 mA transmitter is based on the output signal.

Additionally, in some preferred forms, the measured second voltage across the second current-sense resistor is provided to a signal conditioner or signal amplifier connected in parallel with the second current-sense resistor, the signal conditioner or signal amplifier being configured to provide an output signal based on the measured second voltage across the second current-sense resistor.

Moreover, in some preferred forms, determining the current associated with the 4-20 mA transmitter is based on the output signal.

Furthermore, in some preferred forms, the output signal is provided to a controller or other field device connected in series with the secondary winding.

DETAILED DESCRIPTION

Figure 1:
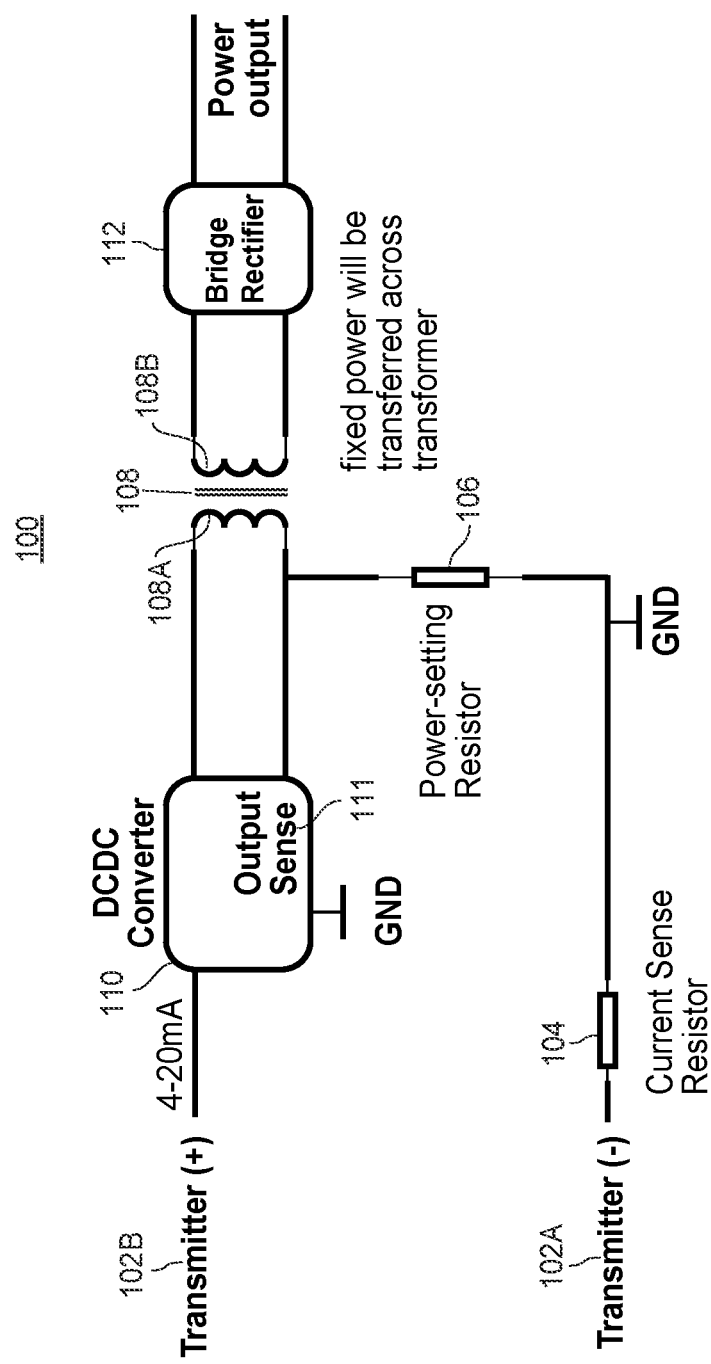
FIG. 1 illustrates an exemplary circuit for a 4-20 mA transmitter that transfers only power across a transformer's galvanic isolation.

Referring now to the drawings, FIG. 1 illustrates an exemplary circuit 100 for a conventional 4-20 mA transmitter that transfers only power across a transformer's galvanic isolation. The negative terminal 102A of a 4-20 mA transmitter 102 may be connected in series to a current-sense resistor 104 over which a voltage corresponding to a current signal from the 4-20 mA transmitter 102 may be measured. This measured voltage may be used by another part of the circuit (not shown) to check and regulate 4-20 mA transmitter current. The current-sense resistor 104 is further connected in series with a power-setting resistor 106, which is further connected in series with the primary winding 108A of a transformer 108. The power-setting resistor 106 is configured such that a consistent power is provided across the primary winding 108A of the transformer 108 to the secondary winding 108b of the transformer regardless of the current signal from the negative terminal 102A of the 4-20 mA transmitter 102. A DC/DC converter 110 connected in series with the primary winding 108A of the transformer 108 is configured to draw fixed current in series with the transformer's primary winding 108A. An output sensor 111 allows the DCDC converter to sense its output voltage and regulate this output voltage accordingly. Meanwhile, the power transferred to the secondary winding 108b of the transformer 108 is provided to a bridge rectifier 112, which converts the AC voltage from the secondary winding 108b of the transformer 108 to DC voltage, which may be used to power a controller or other device connected in series with the bridge rectifier 112.

Figure 2:
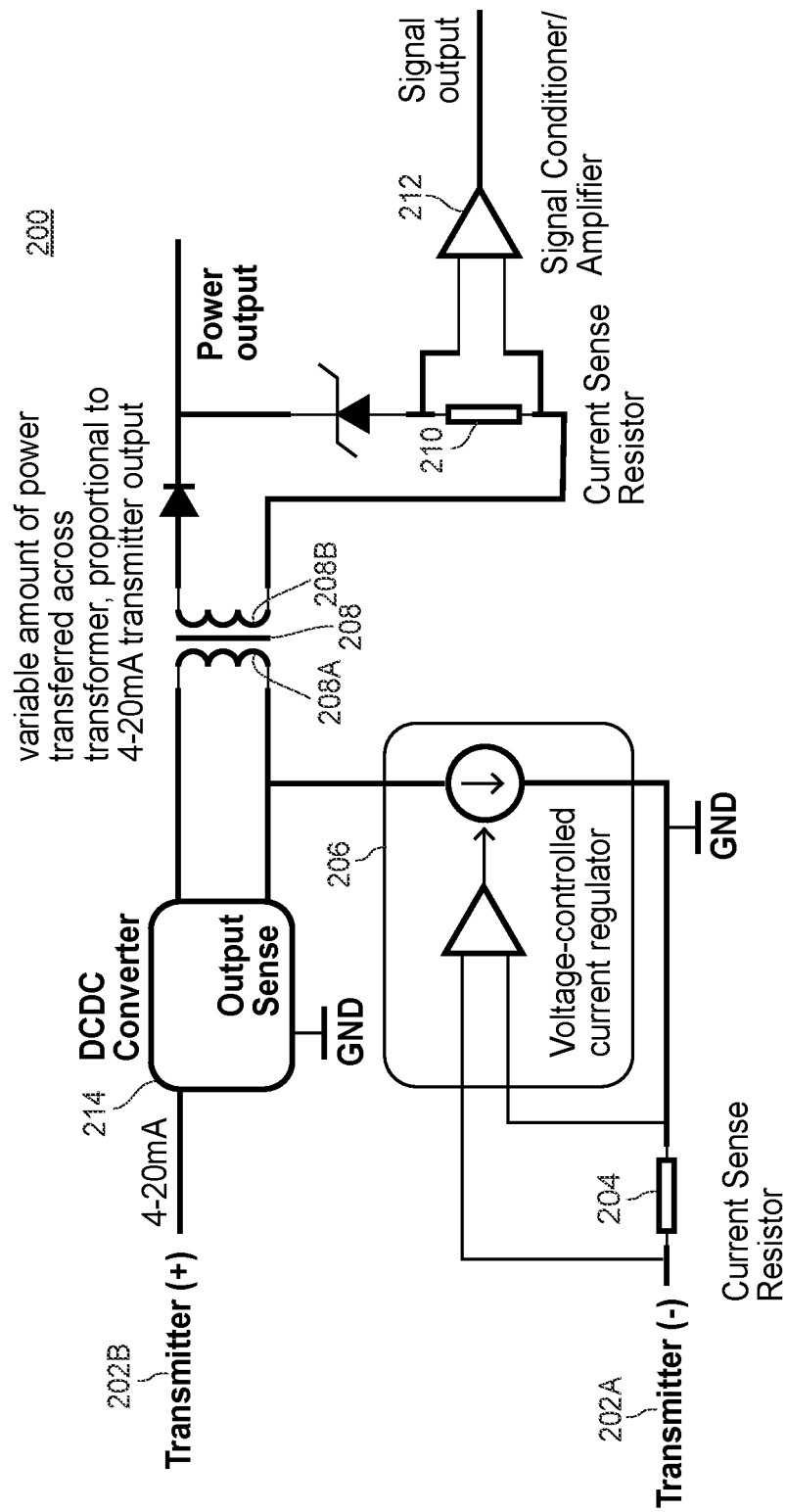
FIG. 2 illustrates an exemplary circuit for a 4-20 mA transmitter that transfers both power and signal across a transformer's galvanic isolation.

In contrast, FIG. 2 illustrates an exemplary circuit for a 4-20 mA transmitter that uses the methods provided herein to transfer both power and signal across a transformer's galvanic isolation. The negative terminal 202A of a 4-20 mA transmitter 202 may be connected in series to a current-sense resistor 204 over which a voltage corresponding to a current signal from the 4-20 mA transmitter 202 may be measured. The current-sense resistor 204 is further connected in series with a voltage-controlled current regulator 206, which is further connected in series with the primary winding 208A of a transformer 208. The voltage-controlled current regulator 206 is configured to regulate the current based on the voltage measured across the current-sense resistor 204 such that the power provided across the primary winding 208A of the transformer 208 to the secondary winding 208B of the transformer is varied proportionally as the current signal from the negative terminal 202A of the 4-20 mA transmitter 202 is varied (e.g., based on signals generated by the transmitter 202).

A current-sense resistor 210 is connected in series with the secondary winding 208B of the transformer 208, such that voltage measured across the current-sense resistor 210 is proportional to the current signal from the negative terminal 202A of the 4-20 mA transmitter 202. That is, based on a known proportionality of the current regulated by the voltage-controlled current regulator 206 to the current signal from the negative terminal 202A of the 4-20 mA transmitter 202, and/or a known current proportionality across the primary winding 208A and secondary winding 208B of the transformer 208, the current signal from the negative terminal 202A of the 4-20 mA transmitter 202 may be determined. A signal conditioner/amplifier 212 may be connected in parallel with the current sense resistor 210 to amplify the proportional gain and provide a signal output proportional to (or otherwise corresponding to) the signal generated by the 4-20 mA transmitter 202 for use as a diagnostic for further processing. For instance, the signal output may provide the signal to a controller or other device as needed. For example, the signal may be provided to other circuits within the same device as the 4-20 mA transmitter, or to field devices (e.g.

another instrument in the same plant) or other types of devices (e.g. visual indicators, such as LEDs).

Figure 3:
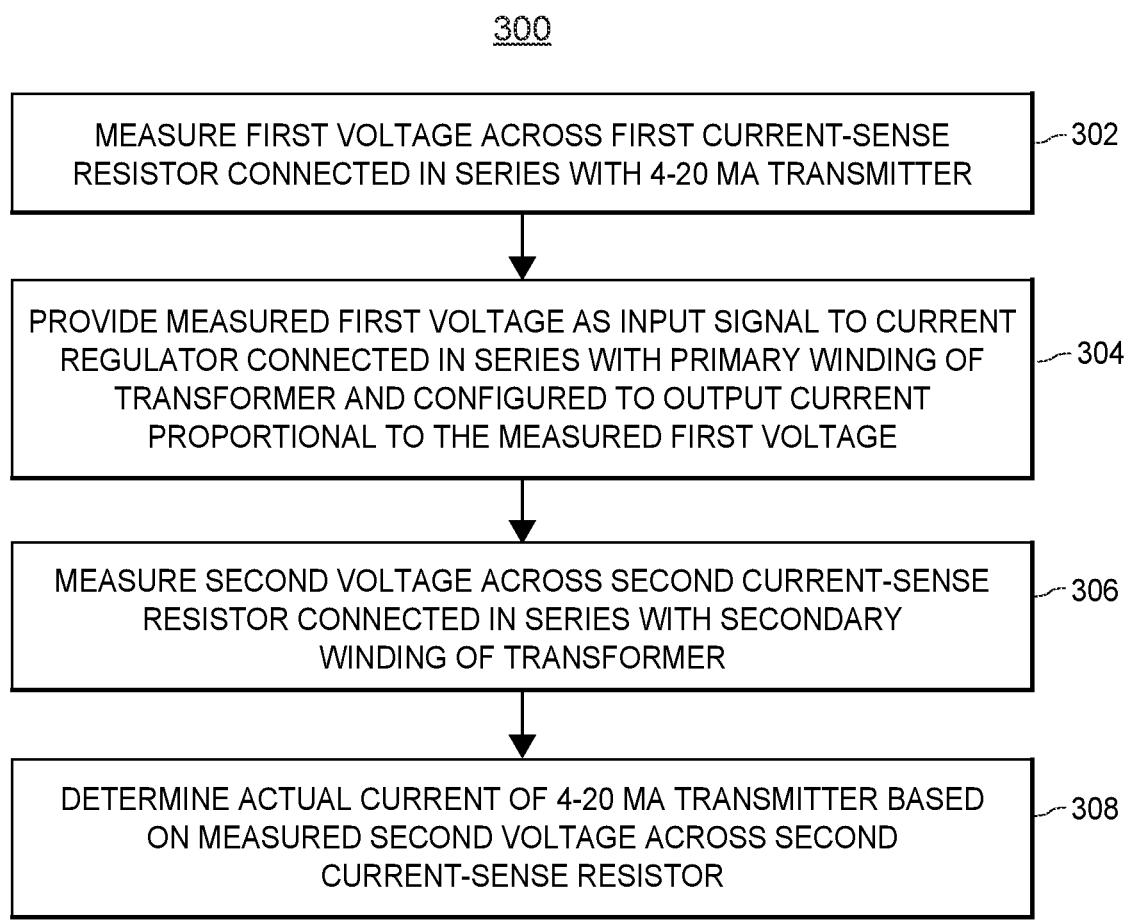
FIG. 3 illustrates a flow diagram of an exemplary method of using a 4-20 mA transmitter to provide both power and signal across galvanic isolation.

FIG. 3 illustrates a flow diagram of an exemplary method 300 of using a 4-20 mA transmitter to provide both power and signal across galvanic isolation. At block 302, a first voltage may be measured across a first current-sense resistor connected in series with a 4-20 mA transmitter. At block 304, the measured first voltage may be provided as an input signal to a current regulator connected in series with the primary winding of a transformer.

At block 306, a second voltage across a second current-sense resistor connected in series with the secondary winding of the transformer may be measured. In some examples, the measured second voltage across the second current-sense resistor may be provided as an output signal in series with the secondary winding. Moreover, in some examples, the measured second voltage across the second current-sense resistor may be provided to a signal amplifier or signal conditioner connected in parallel with the second current-sense resistor. The signal amplifier or signal conditioner may then in turn generate an output signal, which may be provided to a controller or other field device connected in series with the secondary winding of the transformer.

At block 308, the actual current provided by the 4-20 mA transmitter may be determined based on the measured second voltage across the second current-sense resistor. In some examples, the actual current provided by the 4-20 mA transmitter may be determined based on an output signal generated by a signal amplifier or signal conditioner connected in parallel with the second current-sense resistor, as discussed above with respect to block 306. In some examples, determining the current associated with the 4-20 mA transmitter may be based on a known proportionality of the measured first voltage to the output current associated with the current regulator (e.g., by applying the known proportionality to the measured second voltage, or to the output signal). Moreover, in some examples, determining the current associated with the 4-20 mA transmitter may be based on a known current proportionality across the primary winding and secondary winding of the transformer (e.g., by applying the known proportionality to the measured second voltage, or to the output signal).

In some examples, the method 300 may include providing the power transferred from the primary winding to the secondary winding across the transformer as a power output in series with the secondary winding. For example, the power output may be provided to a controller or other field device in series with the secondary winding of the transformer. The controller or other field device to which the power output is provided may be the same controller or field device to which the output signal is provided in some examples, while in other examples it may be a different controller or other field device.

Although the following text discloses a detailed description of example methods, apparatus and/or articles of manufacture, it should be understood that the legal scope of the property right is defined by the words of the claims set forth at the end of this patent. Accordingly, the following detailed description is to be construed as examples only and does not describe every possible example, as describing every possible example would be impractical, if not impossible. Numerous alternative examples could be implemented, using either current technology or technology developed after the filing date of this patent. It is envisioned that such alternative examples would still fall within the scope of the claims.

What is claimed is:

1. A circuit, comprising:
   a 4-20 mA transmitter;
   a transformer having a primary winding and a secondary winding;
   a first current-sense resistor connected in series with the primary winding and a current regulator, wherein the first current-sense resistor is configured to measure a first voltage and provide the measured first voltage to the current regulator, the current regulator being configured to output a current proportional to the measured first voltage; and
   a second current-sense resistor connected in series with the secondary winding, wherein the second current-sense resistor is configured to measure a second voltage such that a current associated with the 4-20 mA transmitter is determined based on the second voltage.

2. The circuit of claim 1, wherein a power transferred from the primary winding to the secondary winding across the transformer is provided as a power output in series with the secondary winding.

3. The circuit of claim 2, wherein the power output is provided to a controller or other field device in series with the secondary winding.

4. The circuit of claim 1, wherein determining the current associated with the 4-20 mA transmitter is based on a proportionality, of the measured first voltage to the output current, associated with the current regulator.

5. The circuit of claim 1, wherein determining the current associated with the 4-20 mA transmitter is based on a current proportionality across the primary winding and secondary winding of the transformer.

6. The circuit of claim 1, wherein the measured second voltage across the second current-sense resistor is provided as an output signal.

7. The circuit of claim 6, wherein determining the current associated with the 4-20 mA transmitter is based on the output signal.

8. The circuit of claim 1, wherein the measured second voltage across the second current-sense resistor is provided to a signal conditioner or signal amplifier connected in parallel with the second current-sense resistor, the signal conditioner or signal amplifier being configured to provide an output signal based on the measured second voltage across the second current-sense resistor.

9. The circuit of claim 8, wherein determining the current associated with the 4-20 mA transmitter is based on the output signal.

10. The circuit of claim 8, wherein the output signal is provided to a controller or other field device in series with the secondary winding.

11. A method, comprising:
    measuring a first voltage across a first current-sense resistor connected in series with a 4-20 mA transmitter;
    providing the measured first voltage as an input signal to a current regulator connected in series with a primary winding of a transformer, the current regulator being configured to output a current proportional to the measured first voltage provided as the input signal;
    measuring a second voltage across a second current-sense resistor connected in series with a secondary winding of the transformer; and
    determining, based on the measured second voltage across the second current-sense resistor, a current associated with the 4-20 mA transmitter.

12. The method of claim 11, further comprising providing power transferred from the primary winding to the secondary winding across the transformer as a power output in series with the secondary winding.

13. The circuit of claim 12, further comprising providing the power output to a controller or other field device in series with the secondary winding.

14. The method of claim 11, wherein determining the current associated with the 4-20 mA transmitter is based on a proportionality, of the measured first voltage to the output current, associated with the current regulator.

15. The method of claim 11, wherein determining the current associated with the 4-20 mA transmitter is based on a current proportionality across the primary winding and secondary winding of the transformer.

16. The method of claim 11, wherein the measured second voltage across the second current-sense resistor is provided as an output signal.

17. The method of claim 16, wherein determining the current associated with the 4-20 mA transmitter is based on the output signal.

18. The method of claim 11, further comprising providing the measured second voltage across the second current-sense resistor to a signal conditioner or signal amplifier connected in parallel with the second current-sense resistor, the signal conditioner or signal amplifier being configured to provide an output signal based on the measured second voltage across the second current-sense resistor.

19. The method of claim 18, wherein determining the current associated with the 4-20 mA transmitter is based on the output signal.

20. The method of claim 19, further comprising providing the output signal to a controller or other field device in series with the secondary winding.

* * * * *

UNITED STATES PATENT AND TRADEMARK OFFICE
CERTIFICATE OF CORRECTION

| | |
|---|---|
| PATENT NO. | : 11,536,751 B2 |
| APPLICATION NO. | : 17/089191 |
| DATED | : December 27, 2022 |
| INVENTOR(S) | : Marwan Brama |

It is certified that error appears in the above-identified patent and that said Letters Patent is hereby corrected as shown below:

In the Specification

At Column 4, Line 13, "1086" should be -- 108B --.

At Column 4, Line 21, "1086" should be -- 108B --.

At Column 4, Line 23, "1086" should be -- 108B --.

In the Claims

At Column 7, Line 3, "circuit" should be -- method --.

Signed and Sealed this
Thirty-first Day of October, 2023

Katherine Kelly Vidal
*Director of the United States Patent and Trademark Office*